(12) United States Patent
Zheng et al.

(10) Patent No.: US 8,582,253 B1
(45) Date of Patent: Nov. 12, 2013

(54) MAGNETIC SENSOR HAVING A HIGH SPIN POLARIZATION REFERENCE LAYER

(75) Inventors: Yuankai Zheng, Fremont, CA (US);
Qunwen Leng, Palo Alto, CA (US);
Mahendra Pakala, Fremont, CA (US);
Zhitao Diao, Fremont, CA (US);
Christian Kaiser, San Jose, CA (US);
Cheng-Han Yang, Moutain View, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/488,219

(22) Filed: Jun. 4, 2012

(51) Int. Cl.
*G11B 5/39* (2006.01)

(52) U.S. Cl.
USPC ........................................... 360/324.2

(58) Field of Classification Search
USPC .................. 360/324.1, 324.11, 324.12, 324.2
See application file for complete search history.

(56) References Cited

U.S. PATENT DOCUMENTS

| | | | |
|---|---|---|---|
| 7,333,303 B2 * | 2/2008 | Shimazawa et al. ..... | 360/324.11 |
| 7,377,025 B2 | 5/2008 | Zhao et al. | |
| 7,672,089 B2 | 3/2010 | Lin | |
| 7,746,603 B2 * | 6/2010 | Gill ........................... | 360/324.12 |
| 7,821,747 B2 * | 10/2010 | Gill ........................... | 360/324.2 |
| 7,920,361 B2 * | 4/2011 | Yoshikawa et al. ........ | 360/324.1 |
| 7,950,136 B2 | 5/2011 | Zhao et al. | |
| 7,983,011 B2 | 7/2011 | Zhao et al. | |
| 8,008,740 B2 | 8/2011 | Zhao et al. | |
| 8,013,408 B2 * | 9/2011 | Maehara et al. .............. | 257/421 |
| 8,081,405 B2 | 12/2011 | Lin | |
| 8,107,202 B2 * | 1/2012 | Lee et al. .................... | 360/324.2 |
| 8,278,123 B2 * | 10/2012 | Choi et al. ......................... | 438/3 |
| 8,445,979 B2 * | 5/2013 | Oh et al. ......................... | 257/421 |
| 2006/0092578 A1 | 5/2006 | Zhao et al. | |
| 2009/0257149 A1 * | 10/2009 | Lee et al. ......................... | 360/314 |
| 2011/0086439 A1 | 4/2011 | Choi | |

* cited by examiner

*Primary Examiner* — Angel Castro

(57) ABSTRACT

A magnetic sensor configured to reside in proximity to a recording medium during use having a high spin polarization reference layer stack above AFM layers. The reference layer stack comprises a first boron-free ferromagnetic layer above the AFM coupling layer; a magnetic coupling layer on and in contact with the first boron-free ferromagnetic layer; a second ferromagnetic layer comprising boron deposited on and contact with the magnetic coupling layer; and a boron-free third ferromagnetic layer on and in contact the second ferromagnetic layer. A barrier layer is deposited on and in contact with the boron-free third ferromagnetic layer. In one aspect of the invention, the magnetic coupling layer may comprise at least one of Ta, Ti, or Hf. A process for providing the magnetic sensor is also provided.

20 Claims, 4 Drawing Sheets

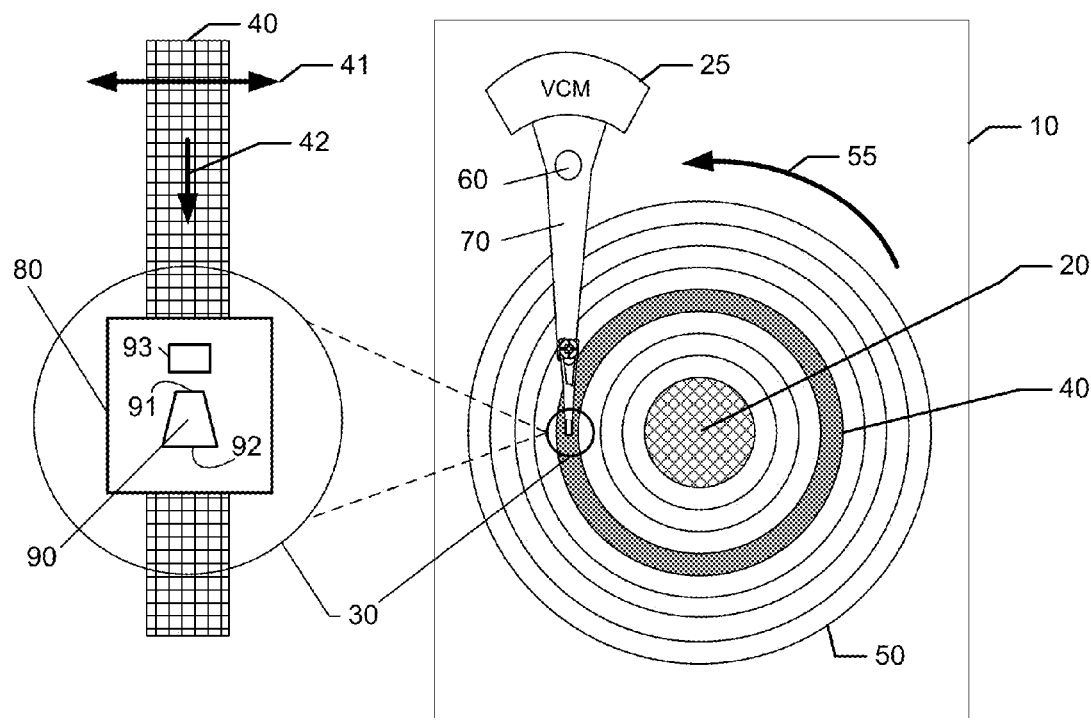
FIG. 1a   FIG. 1
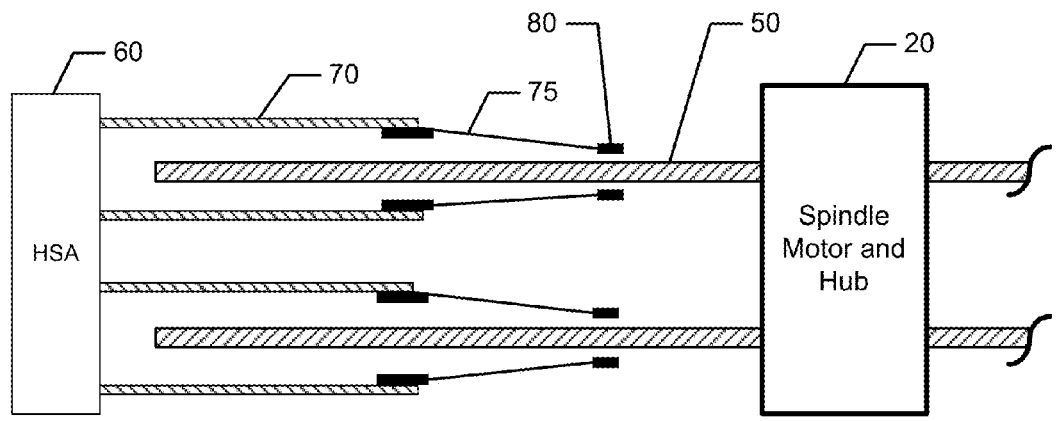
FIG. 2

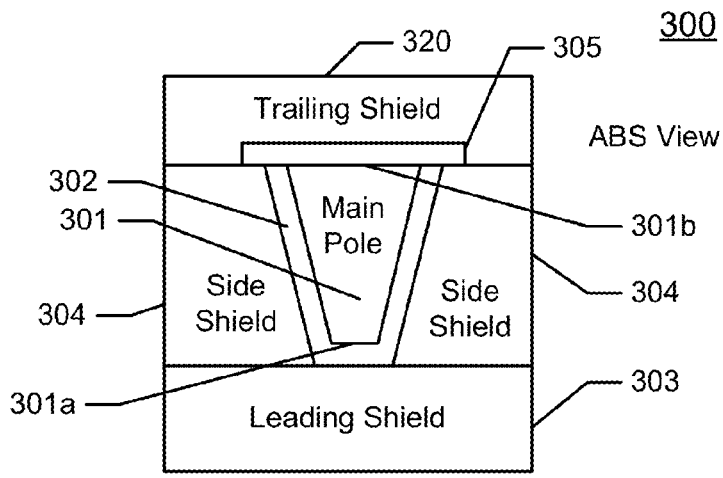
FIG. 3
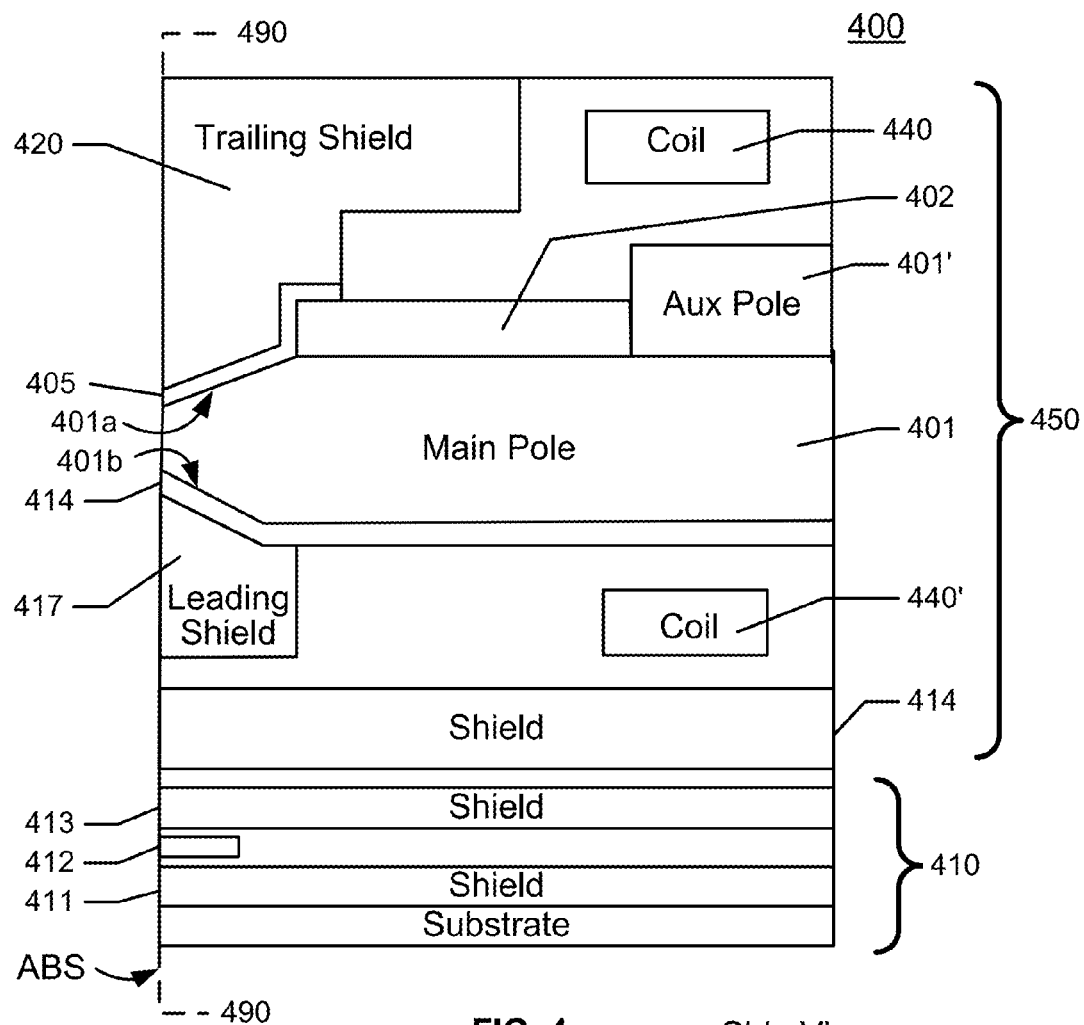
FIG. 4   Side View

US 8,582,253 B1

MAGNETIC SENSOR HAVING A HIGH SPIN POLARIZATION REFERENCE LAYER

BACKGROUND OF THE INVENTION

Disk drives typically use heads residing on sliders to read from and write to the magnetic media. Read and write transducers residing in the head are flown at a small, controlled spacing above the magnetic medium (disk) during read and write operations. An air bearing forms between the head and the disk due to the disk rotating at high speeds to provide controlled head to disk spacing. Magnetic fields emanating from the write transducer pole tip switches magnetization of the magnetic medium, i.e., writing to the medium. Among other factors, a smaller and more tightly controlled magnetic writing field will allow more data to be written in the same space, thereby increasing areal density.

FIG. 1 illustrates a conventional disk drive 10 used for data storage. Figures are not drawn to scale and only certain structures are depicted for clarity. Disk media 50 is attached to spindle motor and hub 20. The spindle motor and hub 20 rotate the media 50 in a direction shown by arrow 55. Head Stack assembly (HSA) 60 includes a magnetic recording head 30 on actuator arm 70 and positions actuator arm 70 by positioning the voice coil motor (VCM) 25 over a desired data track, shown as recording track 40 in this example, to write data onto the media 50.

FIG. 1a illustrates an enlarged view of a section of FIG. 1 including head 30 and track 40. A magnetic recording transducer 90 is fabricated on slider 80. Slider 80 may be attached to suspension 75 and suspension 75 may be attached to actuator arm 70 as shown in FIG. 2. A read transducer 93 is also fabricated on slider 80.

Referring again to FIG. 2, Slider 80 is illustrated above recording track 40. Media 50 and track 40 are moving under slider 80 in a down-track direction shown by arrow 42. The cross-track direction is shown by arrow 41.

The magnetic recording transducer 90 has a leading edge 91 and a trailing edge 92. In this embodiment, the trailing edge 92 of recording transducer 90 is the final portion of magnetic transducer 90 that writes onto the recording track 40 as the media moves under the slider 80 in direction 42.

FIG. 2 illustrates a side view of the disk drive 10 shown in FIG. 1. At least one disk media 50 is mounted onto spindle motor and hub 20. HSA 60 comprises at least one actuator arm 70 that carries suspension 75 and slider 80. Slider 80 has an air bearing surface (ABS) facing media 50. When the media is rotating and actuator arm 70 is positioned over the media 50, slider 80 floats above media 50 by aerodynamic pressure created between the slider ABS and the surface of media 50 facing the ABS of slider 80.

FIG. 3 illustrates an ABS view of a writer 300 of a magnetic recording transducer. The ABS view is the view looking at the ABS of the slider from the viewpoint of the media surface. Main pole 301 of magnetic recording transducer 300 is separated from surrounding structures by nonmagnetic gap 302 and nonmagnetic gap 305. Main pole 301 has leading edge 301a on the leading side of main pole 301 and a trailing edge 301b on the trailing side of main pole 301. A trailing shield 320 is on the trailing side of main pole 301 and a leading shield 303 is on the leading side of main pole 301. Writer portion 300 also has side shields 304 on the sides of main pole 301.

The main pole 301 is illustrated with a conventional trapezoidal shape used in perpendicular magnetic recording (PMR); however, other shapes may also be used. Pole shapes may be, for example, rectangular or triangular. Pole edges illustrated with straight lines may also be implemented as curved or faceted. Those of ordinary skill in the art will recognize that these shapes, combinations or variations of these shapes, and other shapes may be used.

FIG. 4 illustrates a side section view of read/write head 400 incorporating a write transducer 450 and read sensor 410. FIG. 3 depicts an ABS view of a section of writer 300 only, while FIG. 4 depicts a side section view of read/write head 400 with ABS 490, including read sensor 410 and write transducer 450. The read sensor 410 may include shield 411 and shield 413 as well as sensor 412. Write transducer 450 shown in FIG. 4 includes shield 414, main pole 401, assist (or auxiliary) pole 401', coil 440 and coil 440', and trailing shield 420. Main pole 401 has trailing bevel 401a. Write transducer 450 also includes leading shield 417, nonmagnetic layer 414, nonmagnetic gap layer 405, and nonmagnetic spacer 402. Other and/or different components may be fabricated in other embodiments. In some embodiments, coupling layers, stop layers and/or seed layers may also remain between layers as part of the fabrication process.

BRIEF DESCRIPTION OF THE DRAWINGS

FIGS. 1 and 1a illustrate a top view of conventional hard disk drive,

FIG. 2 illustrates a side view of a conventional hard disk drive

FIG. 3 illustrates an ABS view of a section of a perpendicular magnetic head.

FIG. 4 illustrates a section of a side view of a perpendicular magnetic head.

DETAILED DESCRIPTION OF THE INVENTION

Figure 5:
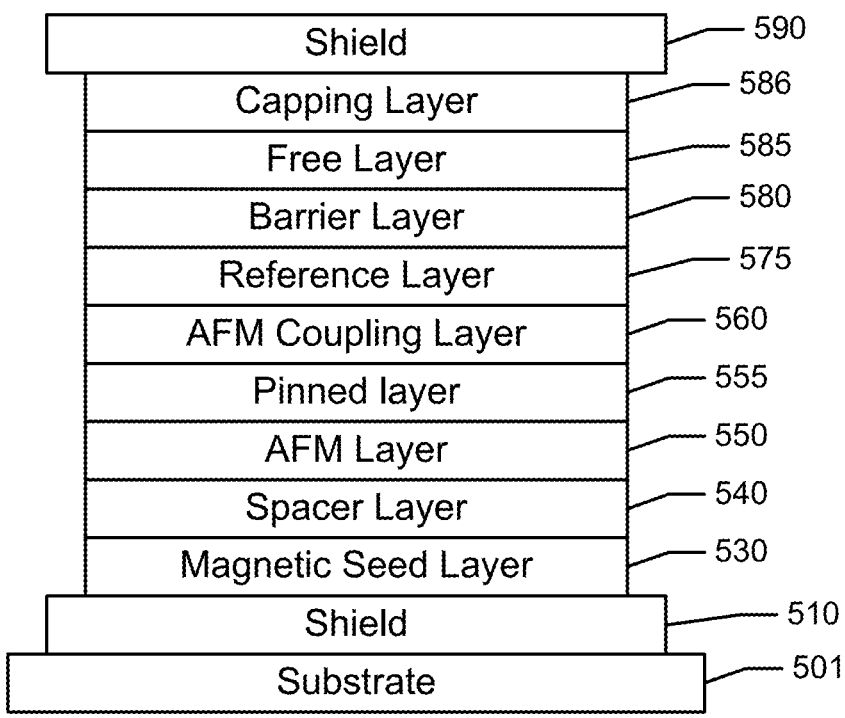
FIG. 5 illustrates a read sensor in accordance with one aspect of the invention.

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention. References to top, side, bottom, or similar terms are used for descriptive purposes with reference to the figures and descriptions and should not be taken as limiting the scope of the invention FIG. 5 illustrates a read sensor 500 in accordance with one aspect of the invention. A bottom shield 510 resides on a substrate 501. The substrate may be any suitable underlayer and may include, for example, alumina (AlOx). Bottom shield 510 may comprise soft magnetic material. A top shield 590 shields the sensing layers and may comprise soft magnetic material.

Read sensor 500 comprises magnetic seed layer 530, spacer layer 540, antiferromagnetic (AFM) layer 550, pinned layer 555, and AFM coupling layer 560. In one aspect of the invention, AFM Layer 550 may comprise IrMn. Spacer layer 540 functions to separate the magnetic seed layer 530 from AFM layer 550 magnetically, so the magnetic seed layer 530 won't be pinned by AFM layer 550. In one embodiment, spacer layer 530 may comprise, for example, Ru, Ti, or Ta.

Pinned layer 555 is above AFM layer 550 and may comprise, for example, CoFe or CoFeB. The AFM layer 550 stabilizes the pinned layer 555. The magnetization (not shown) of pinned layer 555 is substantially fixed, or pinned. AFM coupling layer 560 is above pinned layer and 555 and provides anti-ferromagnetic coupling from the pinned layer 555 to layers above, and may comprise, for example, Ru. In one aspect of the invention, AFM coupling layer 560 may have a thickness less than 0.9 nm.

Reference layer 575 is above AFM decoupling layer 560. A barrier layer 580 is above reference layer 575 and a free layer 585 above barrier layer 580. A capping layer 586 is above free layer 585. Barrier layer 580 has a resistance that varies in response to the relative magnetic orientations of the reference layer 575 below, and the free layer 585 above. The orientation of free layer 585 may move, or switch, in response to an external field such as that from a magnetic recording medium. A sense current may be passed between bottom shield 510 and top shield 590; and as the magnetic field emanating from the recording medium passes the free layer 585, the resistance changes affecting the sense current, which may be used to provide an electrical signal.

In one embodiment of the invention, reference layer 575 comprises a multilayer stack. In one aspect of the invention, barrier layer 580 comprises MgO; and in a further aspect the free layer 585 may comprise NiFe. Capping layer 586 may comprise a plurality of layers, and may comprise Ta.

As recording density increases, a reduction of the spacing between bottom shield 510 and top shield 590 (shield to shield spacing) is required; however, as a result of narrower track widths and decreased shield to shield spacing, reference layer 575 must be improved to maintain signal to noise performance. A need therefore exists for an improved reference layer 575 between the AFM coupling layer 560 and the barrier layer 580.

Figure 6:
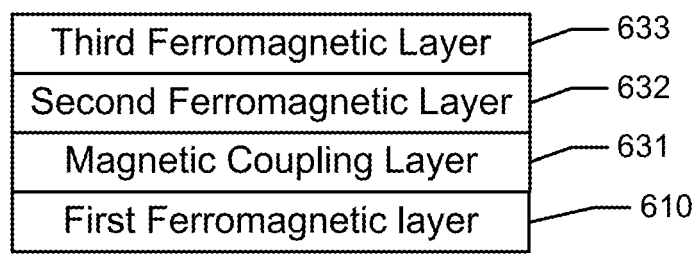
FIG. 6 illustrates a reference layer stack in accordance with one aspect of the invention.

FIG. 6 illustrates a reference layer stack 600 in accordance with one aspect of the invention. Reference layer stack 600 comprises a first ferromagnetic (FM) layer 610, a magnetic coupling layer 631, second FM layer 632, and third FM layer 633. First FM layer 610 resides above AFM coupling layer 560 shown in FIG. 5. In one aspect of the invention, first FM layer 610 is a boron-free soft magnetic material. In another aspect, first FM layer 610 consists of CoFe. In another aspect, the first FM layer 610 is a crystalline alloy of CoFe. In another aspect, first FM layer 610 has a thickness between approximately 0.5 nanometers (nm) and 1.5 nm. In one embodiment of the invention the first FM layer 610 comprises CoFe with a Fe content between approximately 8 and 15 atomic percent. In one aspect of the invention, first FM layer 610 may be deposited with a thickness greater than a final thickness, and then subjected to smoothing by gaseous plasma until a final thickness and/or smoothness is achieved.

Continuing with reference layer stack 600, a magnetic coupling layer 631 is deposited on and in contact with first FM layer 610. In one embodiment of the invention, the magnetic coupling layer 631 comprises at least one of Ta, Ti, or Hf. In one aspect of the invention, magnetic coupling layer 631 consists of Ta. In another aspect of the invention, magnetic coupling layer 631 consists of Ti, and in another aspect, magnetic coupling layer 631 consists of Hf. In another aspect of the invention, magnetic coupling layer 631 has a thickness less than 0.5 nm.

Continuing with reference layer stack 600, second FM layer 632 comprising boron is deposited on and in contact with the magnetic coupling layer 631. In one aspect of the invention, the second FM layer 632 is an amorphous alloy comprising at least one of Co, Fe, and Ni. In one aspect of the invention, second FM layer 632 comprises at least one of CoFeB, CoB, or CoFeNiB. In a further aspect of the invention, second FM layer 632 may have a boron content of between approximately 15 and 25 atomic percent. In another aspect, the second FM layer may have a thickness between approximately 1.5 nm and 2.5 nm. In another aspect of the invention, second FM layer 632 may be deposited with a thickness greater than a final thickness, and then subjected to smoothing by gaseous plasma until a final thickness and/or smoothness is achieved.

Continuing with reference layer stack 600, a boron-free third FM layer 633 is deposited on and in contact with the second FM layer 632. In one aspect of the invention, boron free third FM layer 633 comprises a soft magnetic alloy of Co, Fe, or CoFe. In another aspect, the boron free third FM layer 633 has a thickness between approximately 0.3 nm and 0.7 nm.

In one embodiment of the invention, the boron free third FM layer 633 will not be subjected to surface treatments such as gaseous plasma, or have additional layers or elements deposited prior to the deposition of barrier layer 580, i.e., the boron-free third FM layer 633 will remain as-deposited when the barrier layer 580 is deposited thereon.

Reference layer stack 600 provides a reference layer having high spin polarization interface with the barrier layer 580, due at least in part to the thin magnetic coupling layer 631 which provides an amorphous interface to the boron-containing second FM layer, and the very thin third FM layer 633 deposited directly on the second FM layer 632, thereby maintaining an extremely smooth amorphous underlayer for the barrier layer 580. The barrier layer 580 may comprise MgO, and is very sensitive to the interface near the barrier, and the third FM layer provided in the manner described will provide high spin polarization, and can improve the sensor sensitivity significantly.

Figure 7:
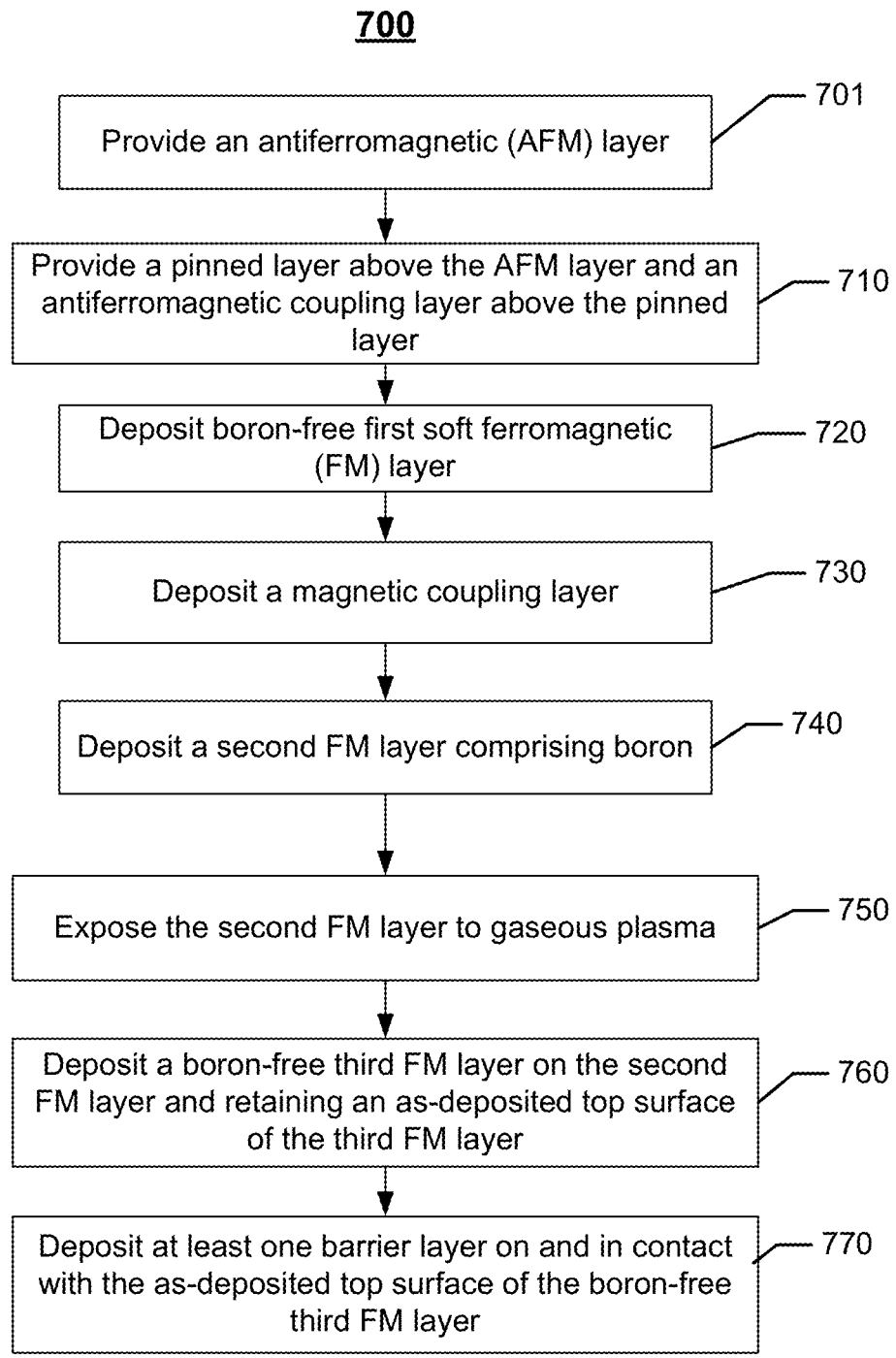
FIG. 7 illustrates a process for providing a reference stack in accordance with one aspect of the invention.

FIG. 7 illustrates a process 700 for providing a reference stack in accordance with one aspect of the invention. Starting in block 701, an AFM layer is provided. One of ordinary skill in the art will recognize that AFM layers are used in read sensors for various reasons, and also recognize the application where the AFM layer is used as a pinning layer for a pinned layer in a magnetoresistive sensor. In block 710, a pinned layer and then an AFM coupling layer is deposited above the AFM layer. The AFM coupling layer may comprise, for example, Ru. In one aspect of the invention, the AFM coupling layer may have a thickness less than 0.9 nm.

After depositing the AFM coupling layer, a first boron-free soft FM layer is deposited. The deposition may be by PVD or IBD process. In one aspect of the invention, the first boron-free soft FM layer is a crystalline soft magnetic material. In another aspect, first boron-free soft FM layer may consist of CoFe. In one embodiment of the invention the first boron-free soft FM layer comprises CoFe with a Fe content between approximately 8 and 15 atomic percent. In another aspect, the first boron-free soft FM layer is a crystalline alloy of CoFe. In another aspect, first boron-free soft FM layer has a thickness between approximately 0.5 nm and 1.5 nm. In another aspect of the invention, the first boron-free soft FM layer may be deposited with a thickness greater than a final thickness, and then subjected to gaseous plasma until a final thickness and/or smoothness is achieved.

Continuing in block 730, a magnetic coupling layer is deposited on and in contact with the first boron-free soft FM layer. The deposition may be by PVD or IBD process. In one embodiment of the invention, the magnetic coupling layer comprises at least one of Ta, Ti, or Hf. In one aspect of the invention, the magnetic coupling layer consists of Ta. In another aspect of the invention, the magnetic coupling layer consists of Ti, and in another aspect, the magnetic coupling layer consists of Hf. In another aspect of the invention, the magnetic coupling layer has a thickness less than 0.5 nm.

Continuing the description of process 700, in block 740 a second FM layer comprising boron is deposited on and in contact with the magnetic coupling layer. The deposition may be by PVD or IBD process. In one aspect of the invention, the second FM layer is an amorphous alloy comprising at least one of Co, Fe, and Ni. In one aspect of the invention, second FM layer comprises at least one of CoFeB, CoB, or CoFeNiB. In a further aspect of the invention, second FM layer may have a boron content of between approximately 15 and 25 atomic percent. In another aspect, the second FM layer may have a thickness between approximately 1.5 nm and 2.5 nm.

In another aspect of the invention, the second FM layer may be deposited with a thickness greater than a final thickness, and then subjected to thinning and/or smoothing by gaseous plasma until a final thickness and/or smoothness is achieved. The plasma may be, for example, Kr or Ar plasma. Plasma treatment, however, affects the surface such that a barrier layer deposited directly on the plasma treated surface will affect the spin polarization of the barrier, and therefore reduce the performance.

Continuing in block 760, the detrimental effect of plasma treatment is remediated by depositing a thin boron-free third FM layer on and in contact with the plasma treated second FM layer. In one aspect of the invention, third FM layer comprises a soft magnetic alloy of Co, Fe, or CoFe. In another aspect, third FM layer has a thickness between approximately 0.3 nm and 0.7 nm.

In block 770, a barrier layer is deposited on and in contact with the as-deposited boron free third FM layer. In one aspect, the barrier layer is deposited on the as-deposited boron free third FM layer; i.e., the boron free third FM layer will not be subjected to surface treatments such as gaseous plasma, or have additional layers or elements deposited prior to the deposition of barrier layer. The thinness of the boron free third FM layer prevents any significant crystallization structure from forming in the layer, thereby providing the advantage of an amorphous material while enhancing the spin polarization characteristics. This advantage can improve the MR of the free layer above the barrier layer significantly. Without the boron free third FM layer, the B in CoFeB would diffuse into the MgO barrier layer, and this reduces spin polarization in addition to the reduced spin polarization from the effect of plasma treatment on the second FM layer. The boron free third FM layer significantly reduces these effects, and thereby provides increased spin polarization.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments of the invention described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

We claim:

1. A magnetic sensor configured to reside in proximity to a recording medium during use, the magnetic sensor comprising:
   a magnetic top shield and a magnetic bottom shield;
   a seed layer above the magnetic bottom shield;
   a spacer above the seed layer;
   an antiferromagnetic (AFM) layer above the spacer layer;
   a pinned layer above the AFM layer;
   an AFM coupling layer above the pinned layer,
   a high spin polarization reference layer stack above the AFM coupling layer, comprising:
      a first boron-free ferromagnetic layer above the AFM coupling layer;
      a magnetic coupling layer on and in contact with the first boron-free ferromagnetic layer;
      a second ferromagnetic layer comprising boron, the second ferromagnetic layer deposited on and contact with the magnetic coupling layer;
      a boron-free third ferromagnetic layer on and in contact the second ferromagnetic layer;
   a barrier layer deposited on and in contact with the boron-free third ferromagnetic layer;
   a free layer above the barrier layer, and
   a capping layer above the free layer.

2. The recording transducer of claim 1 wherein the magnetic coupling layer comprises a layer of elemental Ta.

3. The recording transducer of claim 1 wherein the magnetic coupling layer comprises a material selected from the group consisting of Ta, Ti, and Hf.

4. The recording transducer of claim 1 wherein the second ferromagnetic layer has a boron content between approximately 15 and 25 atomic percent.

5. The recording transducer of claim 1 wherein the first boron-free ferromagnetic layer consists essentially of CoFe.

6. The recording transducer of claim 5 wherein the first boron-free ferromagnetic layer comprises between approximately 8 and 15 atomic percent Fe.

7. The recording transducer of claim 1 wherein the first boron-free ferromagnetic layer has a thickness between 0.5 nanometers (nm) and 1.5 nm.

8. The recording transducer of claim 1 wherein the first magnetic coupling layer has a thickness less than 0.5 nm.

9. The recording transducer of claim 1 wherein the second ferromagnetic layer is an amorphous alloy comprising at least one of Co, Fe, and Ni.

10. The recording transducer of claim 1 wherein the second ferromagnetic layer comprises at least one of CoFeB, CoB, or CoFeNiB.

11. The recording transducer of claim 1 wherein second ferromagnetic layer has a thickness between 1.5 nm and 2.5 nm.

12. The recording transducer of claim 1 wherein the boron-free third ferromagnetic layer comprises a soft magnetic alloy of Co, Fe, or CoFe.

13. The recording transducer of claim 1 wherein the boron-free third ferromagnetic layer has a thickness between 0.3 and 0.7 nm.

14. A magnetic sensor configured to reside in proximity to a recording medium during use, the magnetic sensor comprising:
  an antiferromagnetic (AFM) layer;
  a pinned layer above the AFM layer;
  an AFM coupling layer above the pinned layer;
  a high spin polarization reference layer stack above the AFM coupling layer, comprising:
    a first boron-free ferromagnetic layer above the AFM coupling layer, the first boron-free ferromagnetic layer comprising CoFe or a crystalline alloy of CoFe;
    a magnetic coupling layer on and in contact with the first boron-free ferromagnetic layer, the magnetic coupling layer comprising at least one of Ta, Ti, or Hf;
    a second ferromagnetic layer comprising boron and at least one of Co and Fe, the second ferromagnetic layer deposited on and contact with the magnetic coupling layer;
    a boron-free third ferromagnetic layer on and in contact the second ferromagnetic layer, the third ferromagnetic layer comprising CoFe;
  a barrier layer deposited on and in contact with the boron-free third ferromagnetic layer;
  a free layer above the barrier layer, and
  a capping layer above the free layer.

15. A disk drive comprising:
  a slider including a magnetic sensor, the magnetic sensor configured to reside in proximity to a recording medium during use, the magnetic sensor comprising:
    an antiferromagnetic (AFM) layer;
    a pinned layer above the AFM layer;
    an AFM coupling layer above the pinned layer;
    a high spin polarization reference layer stack above the AFM coupling layer, wherein the reference layer stack comprises:
      a first boron-free ferromagnetic layer above the AFM coupling layer, the first boron-free ferromagnetic layer comprising CoFe or a crystalline alloy of CoFe;
      a magnetic coupling layer on and in contact with the first boron-free ferromagnetic layer, the magnetic coupling layer comprising at least one of Ta, Ti, or Hf;
      a second ferromagnetic layer comprising boron and the second ferromagnetic layer comprising at least one of Co and Fe, the second ferromagnetic layer deposited on and contact with the magnetic coupling layer;
      a boron-free third ferromagnetic layer on and in contact the second ferromagnetic layer, the third ferromagnetic layer comprising CoFe;
    a barrier layer deposited on and in contact with the boron-free third ferromagnetic layer;
    a free layer above the barrier layer, and
    a capping layer above the free layer.

16. A method of providing a high spin polarization reference layer for a magnetic recording sensor, the method comprising:
  providing an antiferromagnetic (AFM) layer;
  providing a pinned layer above the AFM layer;
  providing an AFM coupling layer above the pinned layer;
  depositing a first boron-free ferromagnetic layer above the AFM coupling layer, the first boron-free ferromagnetic layer comprising CoFe or a crystalline alloy of CoFe;
  depositing a magnetic coupling layer on and in contact with the first boron-free ferromagnetic layer, the magnetic coupling layer comprising at least one of Ta, Ti, or Hf;
  depositing a second ferromagnetic layer comprising boron and at least one of Co and Fe, the second ferromagnetic layer deposited on and contact with the magnetic coupling layer;
  after depositing the second ferromagnetic layer, exposing the second ferromagnetic layer to gaseous plasma;
  depositing a boron-free third ferromagnetic layer comprising CoFe, or a soft magnetic alloy of Co, Fe, or CoFe, the third ferromagnetic layer on and in contact the second ferromagnetic layer;
  depositing at least one barrier layer on and in contact with the as-deposited boron-free third ferromagnetic layer.

17. The recording transducer of claim 16 wherein the second ferromagnetic layer has a boron content between approximately 15 and 25 atomic percent.

18. The recording transducer of claim 16 wherein the magnetic coupling layer comprises between approximately 8 and 15 atomic percent Fe.

19. The recording transducer of claim 16 wherein the first boron-free ferromagnetic layer has a thickness between 0.5 nanometers (nm) and 1.5 nm.

20. The recording transducer of claim 16 wherein the magnetic coupling layer has a thickness less than 0.5 nm.

* * * * *